(12) United States Patent
Lee et al.

(10) Patent No.: US 6,443,092 B1
(45) Date of Patent: Sep. 3, 2002

(54) APPARATUS FOR SYNTHESIZING DIAMOND FILM BY DC PACVD

(75) Inventors: Jae-Kap Lee; Young Joon Baik; Kwang Yong Eun, all of Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 09/563,481

(22) Filed: May 2, 2000

(30) Foreign Application Priority Data

Jun. 9, 1999 (KR) .............................................. 99-21389

(51) Int. Cl.[7] .............................................. C23C 16/00
(52) U.S. Cl. .............................. 118/723 E; 118/723 MF
(58) Field of Search ....................... 204/298.06, 298.08, 204/298.12, 298.26, 298.34; 118/723 E, 723 ER, 723 MP; 156/345

(56) References Cited

U.S. PATENT DOCUMENTS

| 5,647,964 A | 7/1997 | Lee et al. |
| 6,077,406 A | * 6/2000 | Kawakubo et al. .... 204/298.12 |

* cited by examiner

Primary Examiner—Gregory Mills
Assistant Examiner—Luz Alejandro
(74) Attorney, Agent, or Firm—Scully, Scott, Murphy & Presser

(57) ABSTRACT

The present invention relates to a diamond film synthesizing apparatus, and in particular to an apparatus for increasing the deposition area to several inches in diameter by using multiple cathodes (Multi-cathode DC PACVD). In the multi-cathode DC PACVD apparatus according to the present invention, the basic array of the cathodes is determined so that the uniformity of diamond films on a deposition area is maximized. A seven-cathode structure, in which six cathodes are radially arranged at the same distance of 43 mm surrounding one central cathode, in which a basic unit of the array is regular triangle, is designed for depositing uniform diamond films on a 4" substrate. Here, the shape of six edge cathodes is rod of which the lateral face is joined to the connecting rod, so that non-uniformity of temperature in the edge cathode is minimized and then the reliability of the apparatus is much enhanced. The multi(7)-cathode DC PACVD apparatus enables one to deposit 4" diamond films with a thickness uniformity of 3.8% thicker than 1 mm. The unit of the cathode array according to the present invention can be adapted when increasing the deposition area to 8 inches, 12 inches, etc.

3 Claims, 4 Drawing Sheets

APPARATUS FOR SYNTHESIZING DIAMOND FILM BY DC PACVD

BACKGROUND OF THE INVENTION

1. Field of the Invention

The present invention relates to an apparatus for synthesizing diamond films by a Direct Current Plasma Assisted Chemical Vapor Deposition (DC PACVD), and in particular to an apparatus for increasing the deposition area to several inches in diameter by using multiple cathodes (Multi-cathode DC PACVD). The present invention overcomes the problem of non-uniformity of diamond films and instability in the system of the U.S. Pat. No. 5,647,964.

2. Description of the Background Art

Since it was reported in the 1980's that diamonds could be deposited by a CVD method, there have been many studies to develop a new method for diamond deposition. Some methods, such as a hot filament CVD, high power microwave(MW) PACVD and DC arc-jet processes have shown excellent performance in diamond deposition, and are currently used in the industry. The hot filament CVD method with simple structure is possible to deposit diamond films on a large area, about ten inches in diameter. However, diamond films contains a lot of non-diamond phases, and the growth rate is less than few $\mu$m/h. Thus, this method in general is used to deposit diamond films of tool grade(lowest grade in CVD diamonds). While, other two processes can deposit high quality diamond films, which are applicable to thermal management substrates(thermal grade: medium grade) or window materials(optical grade: highest grade). They can deposit diamond films on a large area above 8" in diameter at a growth rate higher than that by the hot filament CVD method.

Nevertheless, the cost of diamond films is still high, due to the high cost in equipments and operations.

On the other hand, the DC PACVD method is expected to be the most economical one among all other CVD processes for depositing thermal or optical grade diamond films, because the equipment is very simple with small gas consumption, and generates near thermal plasma which enables deposition of high quality diamond films at a growth rate equivalent to that by the DC arc jet process, However, it had some critical problems of instability of the plasma and a small deposition area around 1 inch in diameter.

We had stabilized DC plasma by using a hot cathode of which temperature was maintained higher than 2000° C. to prohibit the deposition of the solid carbon on the cathode surface, that was a main cause of an arc generation which shut down the DC glow discharge, in U.S. Pat. No. 5,647,964. In this patent, we also had showed a concept that DC plasma could be expanded by using multiple cathodes(multi-cathode DC PACVD), which would enlarge the deposition area.

However, diamond films deposited by the multi-cathode DC PACVD apparatus using three cathodes(three-cathode structure) on a substrate with 4 inches in diameter was not uniform. The uniformity of the film thickness is higher than 50%. Here, the uniformity of the film thickness may be computed by the following Equation.

$$\text{Uniformity} = \frac{\text{Max film thickness } (T_{max}) - \text{Min film thickness } (T_{min})}{\text{Max film thickness } (T_{max})} \times 100$$

Such non-uniformity of the films was due to the non-uniformity of the plasma generated in the three-cathode structure. We observed that the plasma was not uniform, but was nearly independent of each other. Therefore, in the multi-cathode DC PACVD method, the uniformity of the plasma, affecting directly the uniformity of diamond films, is very dependent on the inter-cathode distance. Thus, in order to deposit a uniform film on a deposition area, the inter-cathode distance has to be maintained within a certain range.

In addition, in the multi-cathode DC PACVD apparatus, using a disc-shaped cathode as shown in U.S. Pat. No. 5,647,964, does not guarantee its stability. In the apparatus, plasmas formed under each cathode shifts to the central direction and this gives rise to a temperature difference on each cathode; lower temperature at outer zone than that of the inside. In this case, a solid carbon deposits easily on the lower temperature zone of the cathode, especially at a high methane concentration over 8%. Also the temperature gradient of the cathode causes a concentration of the electric field at the high temperature zone of the cathode, and may be easily transformed to arc.

SUMMARY OF THE INVENTION

Accordingly, it is an object of the present invention to provide an apparatus for synthesizing a diamond film by a multi-cathode DC PACVD which is capable of maximizing the uniformity of crystallinity and thickness of diamond films on a certain deposition area, and minimizing the temperature difference in each cathode for thereby removing instability of the apparatus and implementing good reliability of the apparatus.

To achieve the above objects, there is provided an apparatus for synthesizing a diamond film by the multi-cathode DC PACVD wherein the number of the cathodes is seven, and six cathodes are radially arranged at an angle of 60° about one central cathode, so that a basic array of the cathode is a regular triangle in which the inter-cathode distance is variable with a diameter of the substrate. Also, the shape of the six cathodes disposed at edge is rod of which the lateral face is joined to a connecting rod, so as non-uniformity of the temperature in the cathode to minimize.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The description of the present invention will be explained with reference to the accompanying drawings.

In a multi-cathode DC PACVD with a plurality of cathodes, the uniformity of the thickness and crystallinity of films are greatly dependent on the inter-cathode distance since the plasma generated under each cathode is nearly independent of each other. Therefore, to deposit uniform films on a given area, the cathodes should be arranged for even distribution of the whole plasma. In the present invention, the apparatus for synthesizing a diamond film based on a DC PACVD includes a vacuum pump and a gas supply system, an electric power supply system, and a vacuum chamber that consists of a top plate in which cathodes are fixed, and a grounded anode on which a substrate is placed at a certain distance from the cathodes.

Figure 1:
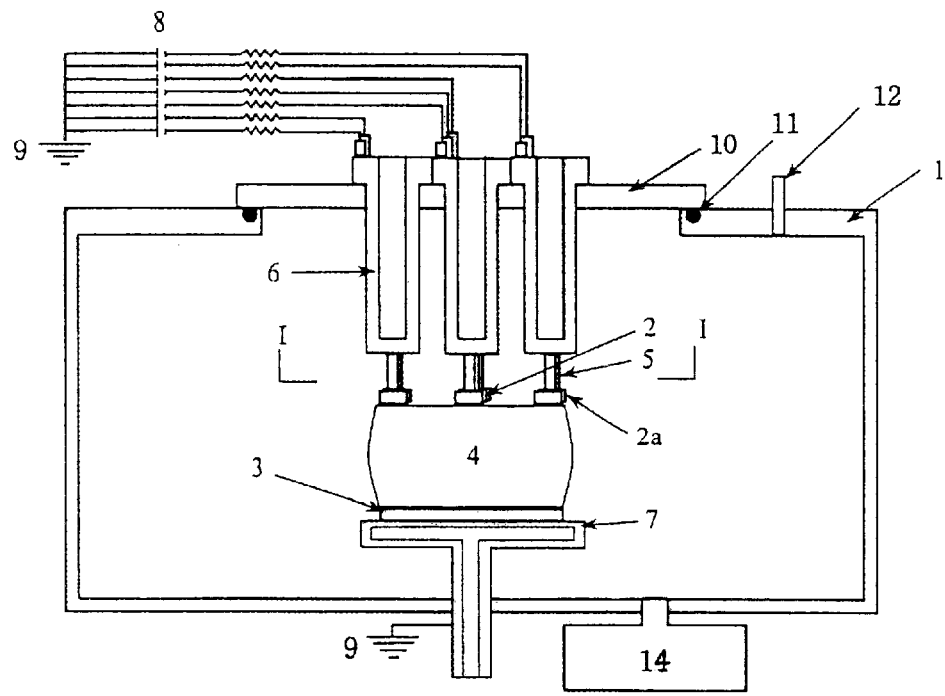
FIG. 1 is a frontal view illustrating the multi-cathode DC PACVD comprising seven cathodes (7-cathode structure) according to the present invention.

As shown in FIG. 1, the multi-cathode DC PACVD apparatus of the present invention is similar to the apparatus disclosed in U.S. Pat. No. 5,647,964 except for the number and shape of the cathodes. In the present invention, the number of the cathodes 2 is seven, and each cathode 2 is fixed to a top plate 10 engaged with the vacuum chamber 1 by an O-ring 11. In addition, each cathode 2 is connected to the water cooled copper block 6 through a connecting rod 5, and is connected to a DC power supply 8. The diameter of a substrate 3 is 4 inches, and an anode 7 is grounded at 9 and is movable upwardly and downwardly and is rotatable. The distance between the cathode and the substrate is about 40 mm. Vacuum state is achieved by a pump 14, and gas is supplied via a gas inlet port 12 disposed above the apparatus.

Figure 2:
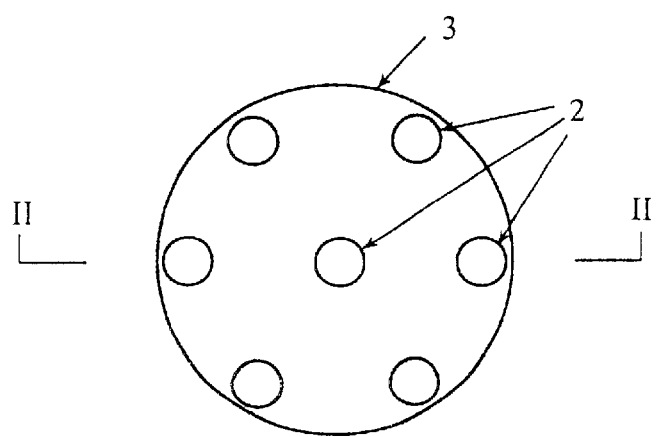
FIG. 2 is a planar view taken along line I—I of FIG. 1 and illustrating an arrangement of the 7-cathode structure according to the present invention in which the cathode shape is disc-type.

FIG. 2 is a cross-sectional planar view taken along line I—I of FIG. 1. Six cathodes are disposed at an angle of 60° surrounding one central cathode which is disposed at the center of the substrate 3 having a diameter of 4 inches. The shape of each cathode is a disc-type. The basic unit of the arrangement of the cathodes is a regular triangle, and the distance between the cathodes is 43 mm. (When using the 3 inch substrate, the inter-cathode distance is 33 mm). The diameter of the cathode is 10 mm with a height of 4 mm.

Figure 3:
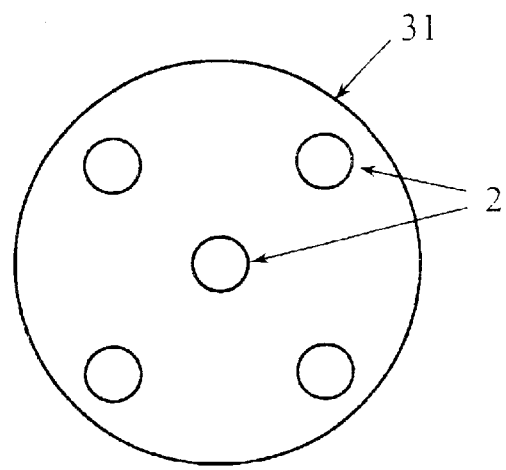
FIG. 3 is a planar view illustrating an arrangement of the 5 cathodes structure in which the cathode shape is disc-type.

Prior to design the 7-cathode structure, a 5-cathode structure was used to deposit diamond films on a 3-inch substrate 31 as shown in FIG. 3, in which four cathodes surrounded one central cathode in which the angle between the edge cathodes was 90°. The inter-cathode distance between the central cathode and each edge cathode was 33 mm, and the distance between the neighboring edge cathodes was 47 mm. A film synthesized by 5-cathode structure was not uniform; films deposited between the central cathode and each edge cathode and under each cathode showed a high crystallinity, while that deposited between the edge cathodes showed very low crystallinity. This meant that the inter-cathode distance 33 mm was sufficient to deposite a high crystalline diamond films, while the inter-cathode distance 47 mm was too far to deposit high crystalline diamond films. In the 5-cathode structure of FIG. 3, to determine an optimum (maximum) inter-cathode distance allowing to deposit continuous diamond films at the inter-cathode zone, depositions were performed by increasing the inter-cathode distance between the central cathode and edge cathodes from 33 mm to 47 mm on a 4-inch substrate 43 mm of the inter-cathode distance was sufficient to deposit a continuous film at the inter-cathode zone. This result allowed for the design of the 7-cathode structure as shown in FIG. 2.

Figure 4:
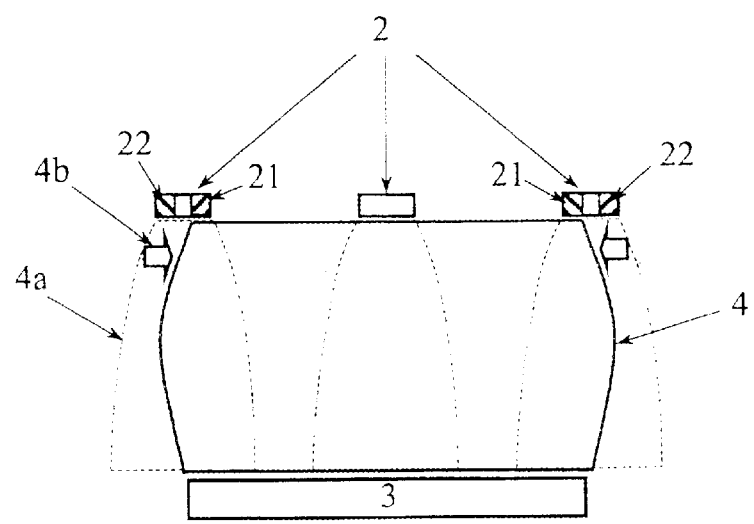
FIG. 4 is a frontal view taken along line II—II of FIG. 2 and illustrating plasma formed under the seven cathodes which is shrunk and results in making a temperature difference with the position of edge cathodes with disc-type.

FIG. 4 is a schematic view taken along line II—II of FIG. 2 and illustrates plasma formed under the seven cathodes which is shrunk and results in making a temperature gradient on the edge cathodes with disc-type. The broken line 4a represents plasma formed by assuming that each cathode is independent of each other like in a single cathode DC PACVD system. The plasma 4 can be assumed as a wholly continuous as long as the inter-cathode distance is kept within around 43 mm. Here, a distinctive feature is that the plasma 4 is contracted 4b and its boundary is shifted to the central direction. Such contraction of the plasma makes a temperature gradient on the edge cathode 2 to be higher at its inner portion 21 than that at its outer portion 22 because in the DC PACVD method the cathode is heated by the collision of positive ions which is one kind of elements composing the plasma. The difference of the temperature between the two regions 21 and 22 is about 100° C. when the temperature is measured by a pyrometer. The actual temperature difference must be much higher than the value considering the low resolution of the pyrometer. In this case, even when a measured temperature of the cathode's main body is above about 2200° C., the lower temperature side of the edge cathode 2, namely, the temperature of the outer portion 22 of the edge cathode 2 may be below 2000° C. so that a solid carbon can be formed on its surface. The solid carbon formed on the cathode may cause an arc, so that it is impossible to implement a stable deposition. Such instability is much serious during deposition at a high methane concentration, since the lower limit of the temperature at which solid carbon does not form increases. In the case of the cathode structure of FIG. 4, the solid carbon was always formed at the outer portion of the edge cathode in a methane concentration higher than 8%. In addition, since the density of the thermal electron is proportional to the square of the temperature, the electric field may be concentrated at the high temperature side of the cathode. Here, the DC glow transits easily to the arc.

Figure 5A:
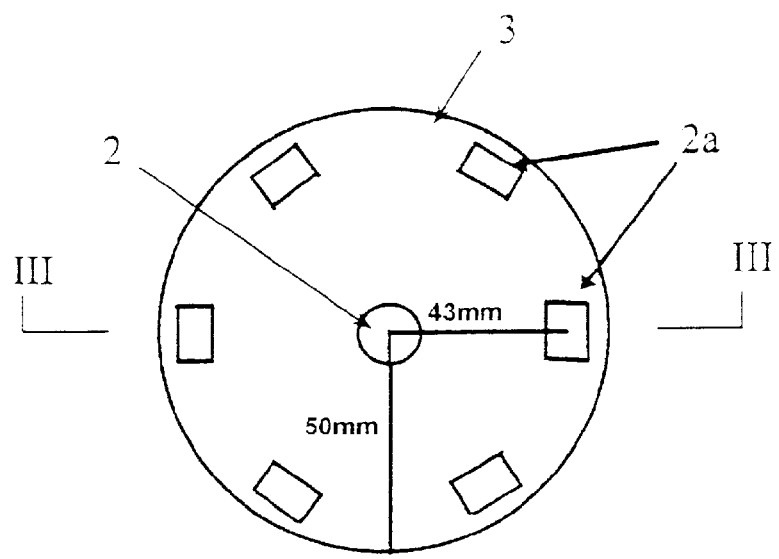
FIG. 5A is a planar view illustrating an arrangement in the 7-cathode structure according to the present invention in which the shape of cathodes is a rod-type except for the central cathode which is disk-type.
Figure 5B:
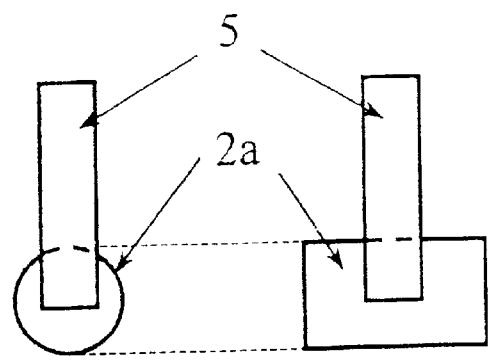
FIG. 5B is frontal and lateral views of the rod-type cathode along line III—III of FIG. 5A according to the present invention.

This instability of the apparatus due to the non-uniformity of the cathode temperature may be fully removed by changing the shape of the edge cathode to a rod shape. FIG. 5A illustrates an arrangement of the seven cathodes which is the same configuration as that of FIG. 2 except for the shape of the edge cathode with rod-type. As shown in FIG. 5B, in the rod shaped cathode 2a, a screw is formed at the side of the rod and is engaged with the connecting rod 5. The diameter of the edge cathode is 6 mm, and the length of the same is 10 mm. As shown in FIG. 5A, the length direction of the edge cathodes is arranged to coincide with the tangential direction of the substrate.

Figure 6:
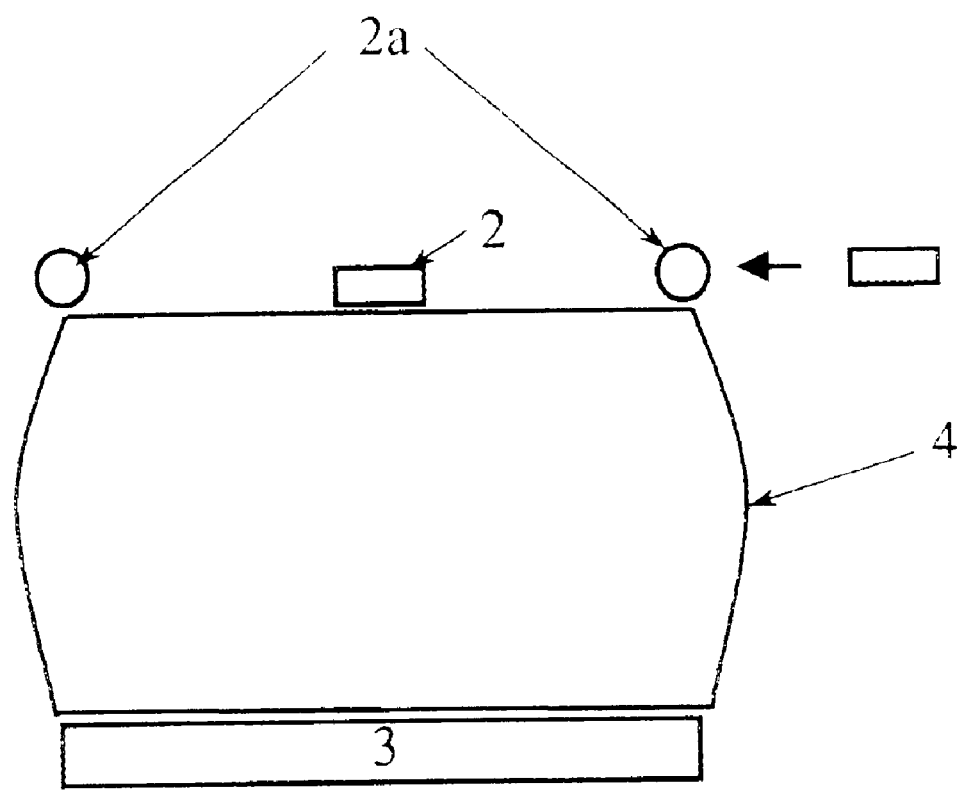
FIG. 6 is a frontal view taken along line III—III of FIG. 5A and illustrating plasma formed under the 7-cathode structure shown in FIG. 5A.

FIG. 6 is a frontal view taken along line III—III of FIG. 5A and illustrates plasma formed under the cathode structure. In this case, the area of the edge cathode no contacting with the plasma may be minimized. Therefore, the temperature of the rod shaped cathode can be maintained uniformly. This allows the system to deposit diamond films even at a high methane concentration up to 15%, and enhance the growth rate at a higher than 16.2 $\mu$m/h on the substrate of a diameter of 4 inches. In addition, with increasing methane concentration, the uniformity of the film increases since each plasma is expanded. At a composition of the methane of 10%~15%, a higher thickness uniformity of 3.8~7% is obtained. The thermal conductivity of the film is 11~13 W/cmK.

The multi(7)-cathode DC PACVD of FIG. 1 is capable of synthesizing thick diamond films with high crystallinity at a high growth rate on a substrate of 4 inches in diameter. This apparatus is capable of enlarging the deposition area above 8 inches in diameter increasing the number of the cathode, based on the array and shape of the cathodes according to the present invention.

The examples of the present invention will be explained in detail.

EXAMPLE 1

A diamond was synthesized using the 7-cathode DC PACVD apparatus having the cathode structure(the distance between the cathodes was 38 mm) as shown in FIG. 2 using a Mo substrate of 3 inches(75 mm) in diameter with conditions of 100 torr, 150 sccm, 1200° C. and 6%$CH_4$ for 197 hours. The deposited film was wholly transparent, of which thickness was 600±20 μm, and of which FWHM value was random between 3.0 $cm^{-1}$ and 3.5 $cm^{-1}$. This meant that the 7-cathode structure could make uniform diamond films in thickness and crystallinity.

EXAMPLE 2

A diamond was synthesized using the 7-cathode DC PACVD apparatus having the cathode structure(the distance between the cathodes was 43 mm) as shown in FIG. 2 using a Mo substrate of 4"(100 mm) in diameter with conditions of 100 torr, 150 sccm, 1250° C. and 8%$CH_4$ for 100 hours. The deposited film was wholly opaque, of which thickness was 800±35 μm, and of which FWHM value was random between 4.0 $cm^{-1}$ and 4.5 $cm^{-1}$.

EXAMPLE 3

A diamond was synthesized using the 7-cathode PACVD apparatus having the cathode structure as shown in FIG. 5A using a Mo substrate of 4"(100 mm) in diameter with conditions of 100 torr, 150 sccm, 1250° C. and 10%$CH_4$ for 100 hours. The deposited film was wholly opaque, of which thickness was 1010±20 μm(growth rate: 10.3~9.9 μm), and of which the thermal conductivity measured by the DC heat flow method was 11~13 W/cmK.

EXAMPLE 4

A diamond was synthesized using the 7-cathode PACVD apparatus having the cathode structure as shown in FIG. 5A using a W substrate of 4"(100 mm) in diameter with conditions of 100 torr, 150 sccm, 1300° C. and 15%$CH_4$ for 80 hours. The deposited film was wholly opaque, of which thickness was 1296±25 μm(growth rate: 16.0~16.5 μm), and of which the thermal conductivity measured by the DC heat flow method was 9.5~11 W/cmK.

As described above, in the diamond film synthesized by using the multi(7)-cathode DC PACVD method based on the regular triangular array of cathodes according to the present invention, it is possible to deposit a uniform diamond film on a 4" deposition area. In addition, it is possible to remove instability by using a rod shaped cathode as edge cathodes thereby increasing the growth rate and enhancing the reliability of the apparatus. In the present invention, it is possible to easily and economically synthesize thick diamond films on a large area.

Although the preferred example of the present invention have been disclosed for illustrative purposes, those skilled in the art will appreciate that various modifications, additions and substitutions are possible, without departing from the scope and spirit of the invention as recited in the accompanying claims.

What is claimed is:

1. An apparatus for synthesizing a diamond film by a multi-cathode direct current plasma assisted chemical vapor deposition method which includes a vacuum pump, a gas inlet system, a DC supply system and a vacuum chamber comprising a plate fixing a plurality of cathodes which are connected to an independent DC power supply, wherein the number of cathodes is seven, six of said cathodes radially surrounding, at the same distance, one central cathode, so that the basic unit of the cathode array is a triangle.

2. The apparatus of claim 1, wherein the shape of the surrounding cathodes are a rod shape, a triangle column shape or a square column shape.

3. The apparatus of claim 1, wherein the inter-cathode distance is 20 to 50 mm.

* * * * *